(12) United States Patent
Kim et al.

(10) Patent No.: US 8,013,815 B2
(45) Date of Patent: Sep. 6, 2011

(54) ORGANIC ELECTRO LUMINESCENCE DISPLAY DEVICE

(75) Inventors: Iee-Gon Kim, Suwon-si (KR); Tae-Hyung Kim, Suwon-si (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 1309 days.

(21) Appl. No.: 10/989,056

(22) Filed: Nov. 16, 2004

(65) Prior Publication Data

US 2005/0116905 A1      Jun. 2, 2005

(30) Foreign Application Priority Data

Nov. 29, 2003   (KR) .................. 10-2003-0087797

(51) Int. Cl.
*G09G 3/32* (2006.01)
*G09G 3/10* (2006.01)
(52) U.S. Cl. ...................... 345/82; 315/169.3
(58) Field of Classification Search .............. 345/76, 345/80–84; 315/169.3
See application file for complete search history.

(56) References Cited

U.S. PATENT DOCUMENTS

| | | | |
|---|---|---|---|
| 5,977,562 A | 11/1999 | Hirakata et al. | |
| 6,011,531 A | 1/2000 | Mei et al. | |
| 6,771,028 B1 * | 8/2004 | Winters | 315/169.1 |
| 2002/0140364 A1 * | 10/2002 | Inukai | 315/169.3 |
| 2003/0085340 A1 | 5/2003 | Street | |
| 2003/0174106 A1 * | 9/2003 | Tanada et al. | 345/83 |
| 2005/0162356 A1 * | 7/2005 | Koyama et al. | 345/76 |

FOREIGN PATENT DOCUMENTS

| | | |
|---|---|---|
| CN | 1231046 | 10/1999 |
| EP | 0293048 | 11/1988 |
| EP | 0935229 | 8/1999 |
| EP | 0935229 | 11/1999 |
| JP | 2001-109405 | 4/2001 |
| JP | 2002-299051 | 10/2002 |
| KR | 2000-0068316 | 11/2000 |
| KR | 1020020077241 | 10/2002 |

OTHER PUBLICATIONS

Japanese Office action corresponding to Japanese Patent Application No. 2004-344947, issued on Feb. 13, 2007.
Japanese Office action corresponding to Japanese Patent Application No. 2004-344947, issued on Jun. 5, 2007.
*Office action* from the Korean Intellectual Property Office issued in Applicant's corresponding Korean Patent Application No. 10-2003-0087797 dated Mar. 30, 2006.

* cited by examiner

*Primary Examiner* — Alexander S Beck
*Assistant Examiner* — Randal Willis
(74) *Attorney, Agent, or Firm* — Robert E. Bushnell, Esq.

(57) ABSTRACT

An active matrix organic electro luminescence display in which two opposite pixels are formed in one pixel portion to achieve a high aperture ratio and to facilitate a fabrication process. The organic electro luminescence display is constructed with gate lines, data lines, and power lines which are formed on an insulating substrate, and pixel regions which is defined by the gate lines, the data lines and the power lines, wherein each of the pixel regions includes two opposite pixels, and the pixel regions are arranged in a matrix form.

15 Claims, 8 Drawing Sheets

ORGANIC ELECTRO LUMINESCENCE DISPLAY DEVICE

CLAIM OF PRIORITY

This application claims priority to and the benefit of Korean Patent Application No. 2003-87797, filed Nov. 29, 2003, the disclosure of which is incorporated herein by reference in its entirety.

BACKGROUND OF THE INVENTION

1. Field of the Invention

The present invention relates to an organic electroluminescence display and, more particularly, to an active matrix organic electroluminescence display in which two opposite pixels are formed in one pixel portion to achieve a high aperture ratio and to facilitate a fabrication process.

2. Description of the Related Art

A cathode ray tube (CRT) as one of normally used display devices is primarily used for televisions (TVs) as well as monitors of measurement instruments, information terminals, and the like. However, the cathode ray tube cannot satisfy a need for compact and lightweight electronic products because of its weight and size.

Flat panel display devices having compact and lightweight features have been attracted attention as substitutes for the CRT. The flat panel display devices include a liquid crystal display (LCD), an organic electro luminescence display (OELD), and the like.

Of these flat panel display devices, the organic electroluminescence display is an electro luminescence display that emits light when excitons are transitioned from an excited state to a ground state. The excitons are created when respective electrons and holes from an electron injection electrode (i.e., a cathode) and a hole injection electrode (i.e., an anode) are injected into an emission layer and the injected electrons and holes are combined.

This principle eliminates a need for a separate light source, which is needed for a conventional thin film liquid crystal display device. It is, therefore, possible to reduce the volume and weight of the device.

The organic electroluminescence display may be classified into a passive matrix manner and an active matrix manner according to a driving manner.

The passive matrix organic electroluminescence display may be easily fabricated because of its simple configuration. However, there are disadvantages of high power consumption and a difficulty in making a large-sized display device. Also, in making the passive matrix organic electroluminescence display, the aperture ratio is reduced as the number of lines are increased.

For these reasons, the passive matrix organic electroluminescence display is used for a small-sized display device while the active matrix organic electroluminescence display is used for a large-sized display device.

The conventional organic electroluminescence display has a problem in that the thickness of the organic emission layer is not uniform in a stepped portion of the opening corresponding to each pixel, which makes it impossible to achieve uniform luminescence properties.

A method of forming an opening in a stripe manner to solve the aforementioned problem was introduced, as disclosed in Korean Laid-open Patent No. 2002-0077241. A method of forming an opening in a delta manner was also introduced.

There is, however, a problem that when the stripe or delta type is used to increase an aperture ratio, visibility of the organic electroluminescence display is degraded due to optical interference between adjacent pixels.

Further, in the case of forming the opening in the dot manner, the stripe type and the delta type in the organic electroluminescence display, R, G, B pixels are arranged to have the same form in uniform positions. That is, the pixels are arranged uniformly. Since the minuteness of a pattern is inversely proportional to a high aperture ratio, there is a problem associated with the manner of increasing the aperture ratio of the pixel in a stripe or delta type for a high quality data processing that requires a minute pattern as well as a high aperture ratio.

SUMMARY OF THE INVENTION

It is therefore an object of the present invention to provide an improved organic electroluminescence display.

It is also an object of the present invention to solve aforementioned problems associated with conventional devices by providing an active matrix organic electroluminescence display.

It is further an object of the present invention to provide an organic electroluminescence display in which two opposite pixels are formed in one pixel portion to achieve a high aperture ratio and facilitate a fabrication process.

In order to achieve the above and other objectives, an exemplary embodiment of the present invention includes: gate lines, data lines, and power lines formed on an insulating substrate; and pixel regions defined by the gate lines, the data lines, and the power lines, wherein each of the pixel regions includes two opposite pixels, and the pixel regions each having the two opposite pixels are arranged in a matrix form.

It is preferable that the two opposite pixels emit light of the same color. It is preferable that the two opposite pixels use emission layers as common layers.

In another exemplary embodiment according to the present invention, an organic electroluminescence display includes: gate lines and data lines formed on an insulating substrate; and a plurality of pixel regions defined by the gate lines and the data lines, each of the plurality of pixel regions comprising a pair of emission regions, wherein the emission regions in different pixel regions from each other that emit light of the same color are arranged to be equally biased.

It is preferable that the pair of emission regions in the pixel regions use emission layers as common layers, and the pair of emission regions emit light of the same color.

In yet another exemplary embodiment according to the present invention, an organic electroluminescence display includes: gate lines and data lines formed on an insulating substrate; pixel portions partitioned by the gate lines and the data lines, each of the pixel portions having a first pixel and a second pixel, each of the first pixel and the second pixel comprising: a driving transistor for adjusting the amount of emitted light by adjusting the amount of current supplied to an organic emission portion; a switching transistor turned on by a signal applied from the gate line to apply a signal on the data line to the driving transistor; and the organic emission portion, wherein the directions of the currents applied from the switching transistors of the first pixel and the second pixel to the organic emission portions are opposite to each other.

It is preferable that each of the organic emission portions includes a pixel electrode, an organic emission layer and an upper electrode, and the first and second pixels use the organic emission layers as common layers.

In still another exemplary embodiment, two pixels in each of the pixel regions are integrally arranged between two gate lines and the two pixels are formed adjacent and opposite to each other.

In further another exemplary embodiment, two gate lines defining each of the pixel portions are adjacent to each other, and the two pixels are formed symmetrically about the two gate lines.

In still further another exemplary embodiment, two pixels share one gate line and face each other about the power line.

In yet another exemplary embodiment, two data lines defining each of the plurality of pixel portions are adjacent to each other, two pixels are formed symmetrically about the two data lines, and the two pixels share one gate line.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

A conventional organic electroluminescence display will be hereinafter described with reference to the accompanying drawings.

Figure 1:
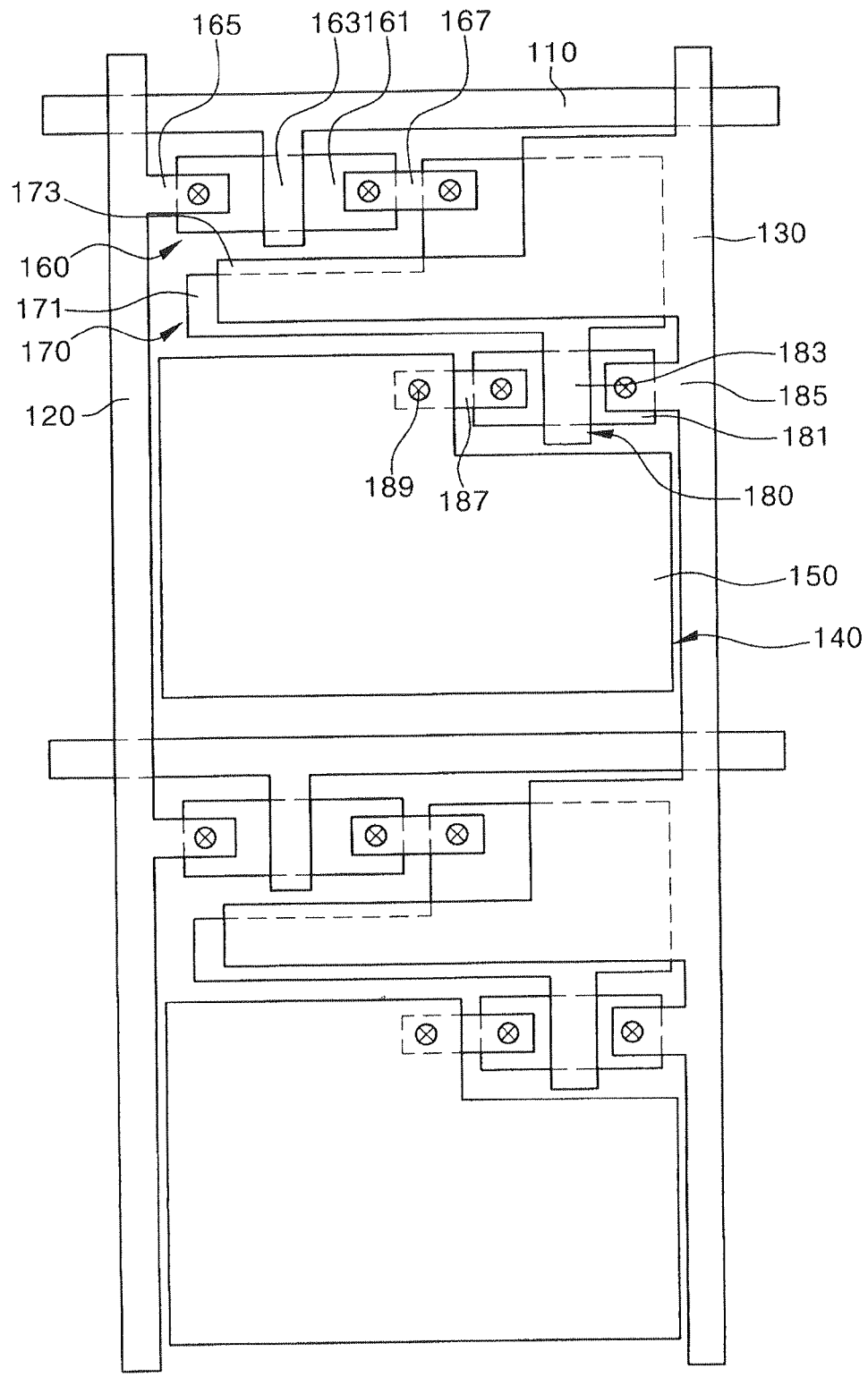
FIG. 1 is a top view of a conventional organic electroluminescence display.
Figure 2:
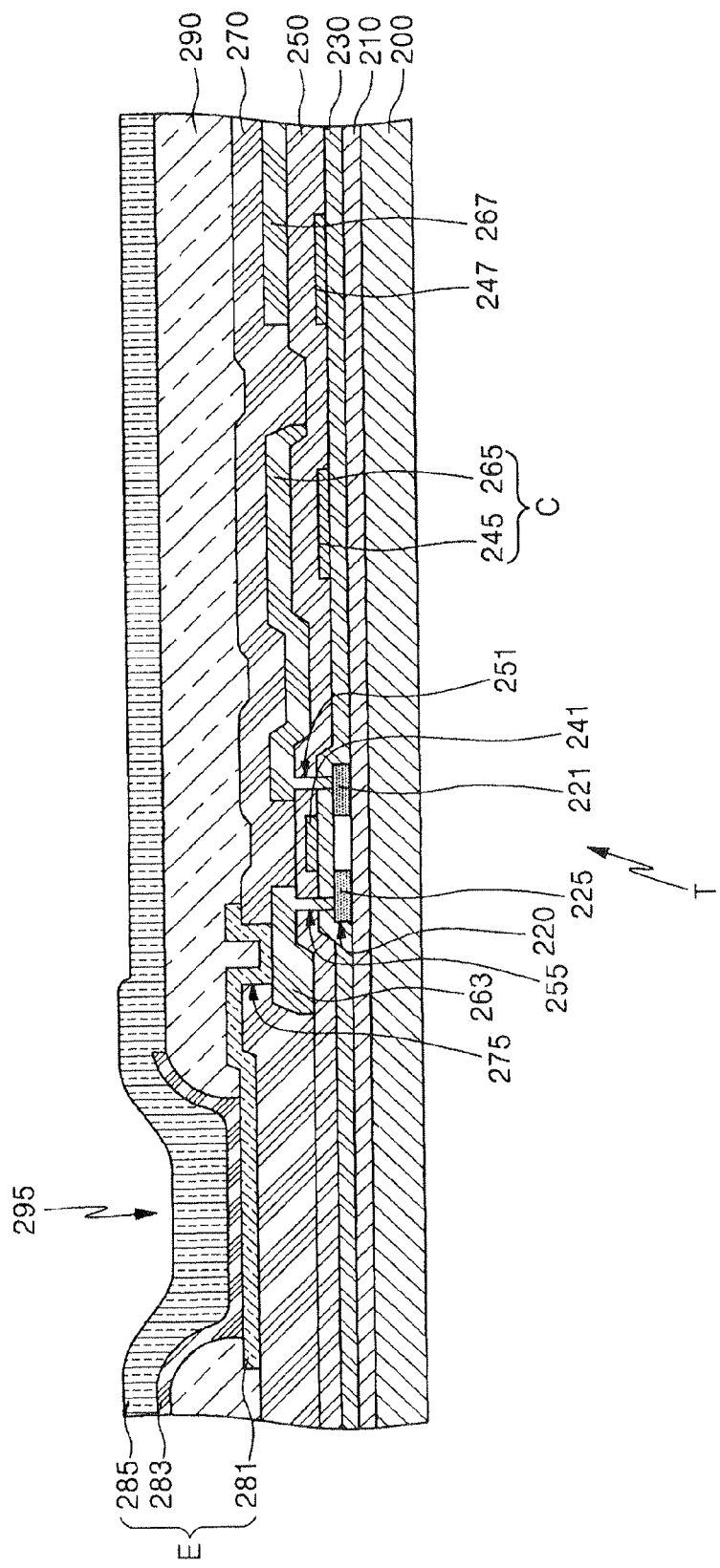
FIG. 2 is a cross-sectional view of a conventional organic electroluminescence display.

FIG. 1 is a top view of a conventional organic electroluminescence display, and FIG. 2 is a cross-sectional view of a conventional organic electroluminescence display. In FIG. 1, the display is shown only with a capacitor, a driving transistor, and an organic electroluminescence element connected to the driving transistor.

Referring to FIG. 1, the conventional organic electroluminescence display includes a plurality of gate lines 110 insulated from one another and arranged in one direction; a plurality of data lines 120 insulated from one another and arranged in a direction intersecting with the gate lines 110; common power lines 130 insulated from one another and arranged to intersect with the gate lines 110 and to be in parallel with the data lines 120; a plurality of pixel regions 140 formed by the gate lines 110, the data lines 120 and the common power lines 130; and a plurality of pixel electrodes 150 each arranged per pixel region 140.

R, G, B unit pixels are arranged in each of the pixel regions 140. Each of the unit pixels includes an organic electroluminescence element having two thin film transistors 160 and 180, one capacitor 170, and the pixel electrode 150. Here, a reference numeral 189 denotes a via-hole for connecting a drain electrode 187 of the driving transistor 180 to the pixel electrode 150.

The switching transistor 160 of the two thin film transistors 160 and 180 includes an active layer 161 having source and drain regions, a gate electrode 163 connected to the gate line 110, and source and drain electrodes 165 and 167 connected to the source and drain regions in the active layer 161 through a contact hole. Further, the driving transistor 180 includes an active layer 181 having source and drain regions, a gate electrode 183, and source and drain electrodes 185 and 187 connected to the source and drain regions in the active layer 181 through a contact hole.

Meanwhile, the capacitor 170 includes a lower electrode 171 connected to a gate electrode 183 of the driving transistor 180 and to the drain electrode 187 of the driving transistor 180 through a contact hole, and an upper electrode 173 connected to the common power line 130 to which the source electrode 185 of the driving transistor 180 is connected through a contact hole. The pixel electrode 150 is connected to the drain electrode 187 of the driving transistor 180 through the via-hole 189.

Referring to FIG. 2, a buffer layer 210 is formed on an insulating substrate 200. An active layer 220 having source and drain regions 221 and 225 is formed on the buffer layer 210. A gate electrode 241, a lower electrode 245 of a capacitor C, and a gate line 247 are formed on a gate insulating layer 230. Source and drain electrodes 263 and 265 connected to the source and drain regions 221 and 225 through contact holes 251 and 255, an upper electrode 285 of the capacitor C connected to one of the source and drain electrodes 263 and 265, for example, the source electrode 263, and a data line 267 are formed on an interlayer insulating layer 250.

A passivation layer 270 is formed on the entire surface of the insulating substrate 200. A lower electrode 281 which is formed on the passivation layer 270 is a pixel electrode of an organic electroluminescence element E connected to one of the source and drain electrodes 263 and 265, for example the drain electrode 265 through a via-hole 275. A pixel defining layer (PDL) 290 is formed which has an opening 295 formed to expose a portion of the lower electrode 281. An organic emission layer 283 is formed on the lower electrode 281 in the opening 295, and an upper electrode 285 is formed on the entire surface of the insulating substrate 200, resulting in the organic electroluminescence element E.

Figure 3:
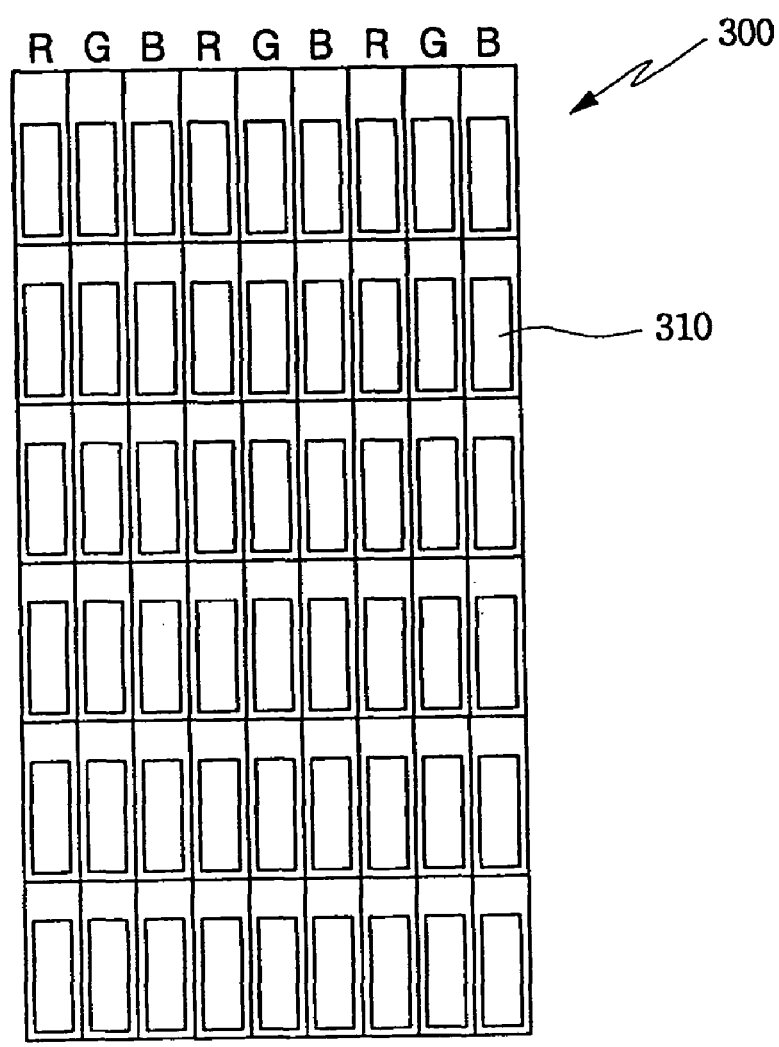
FIG. 3 is a top view illustrating the arrangement of R, G and B pixels of a conventional organic electroluminescence display.

Meanwhile, FIG. 3 is a top view illustrating the arrangement of R, G, B pixels of a conventional organic electro luminescence display. There is shown a structure in which each pixel is a dot matrix type.

Referring to FIG. 3, an organic electroluminescence display 300 is composed of a plurality of pixels 310 that are arranged in a matrix form. Each of the pixels 310 includes a switching transistor and a driving transistor, such as thin film transistors. The organic electroluminescence element emits light as the switching transistor of each pixel 310 is driven by voltages applied to a gate line corresponding to a row and a data line corresponding to a column. An R pixel, a G pixel and a B pixel may be arranged variously. As shown in FIG. 3, for example, the R pixel, the G pixel, and the B pixel may be arranged in the form of a straight line or a stripe (on the column).

There is, however, a problem associated with the organic electroluminescence display as described above that the thickness of the organic emission layer is not uniform in a step of the opening corresponding to each pixel shown in FIG. 3, which makes it impossible to achieve uniform luminescence properties.

Hereinafter, exemplary embodiments of the present invention will be described with reference to the accompanying drawings.

Figure 4:
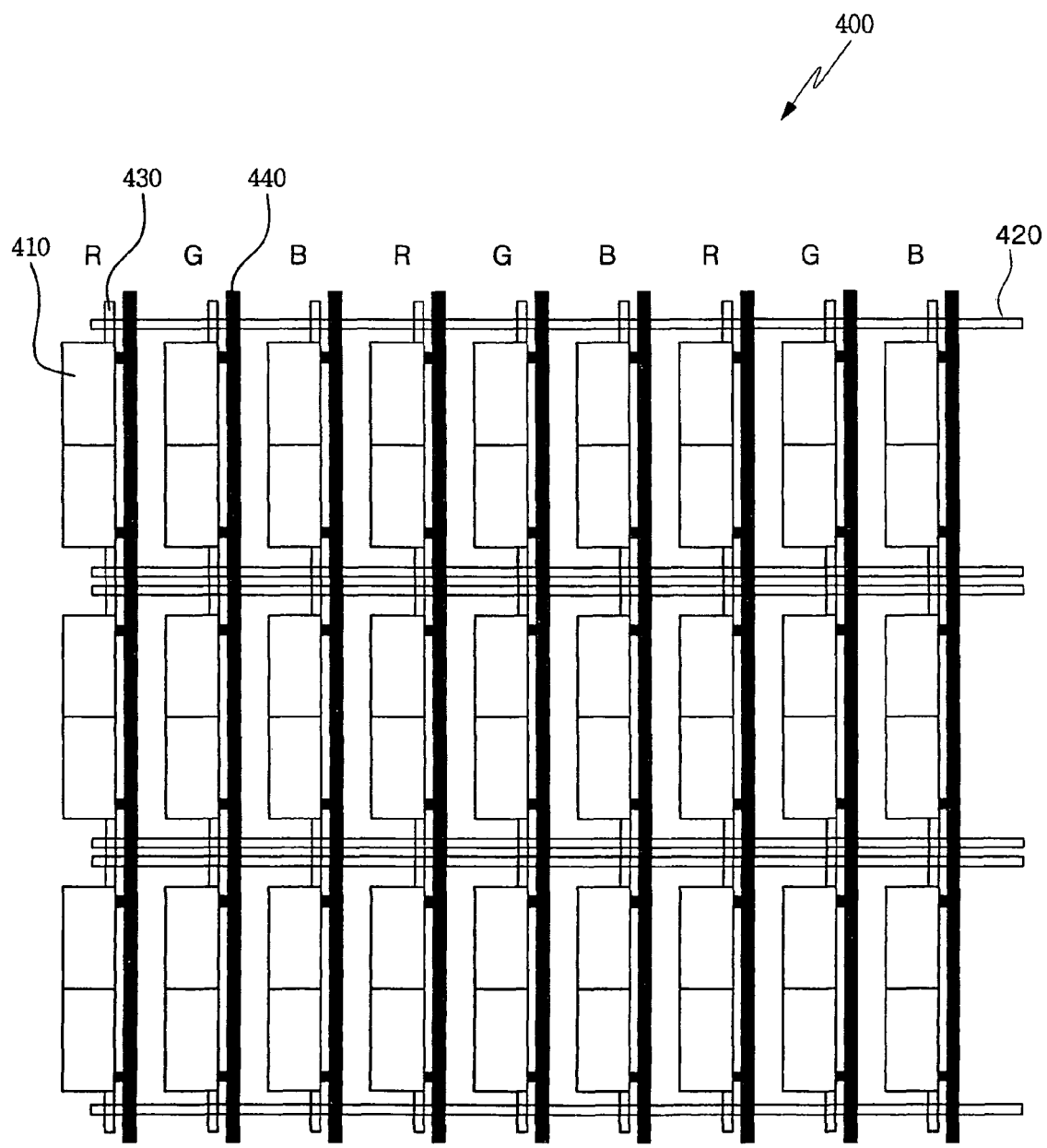
FIGS. 4 and 5 are top views illustrating the arrangement of R, G, B pixels of an organic electroluminescence display according to an exemplary embodiment of the present invention.

FIG. 4 is a top view illustrating the arrangement of R, G, B pixels of an organic electroluminescence display according to an exemplary embodiment of the present invention. There is shown a structure in which two adjacent pixels are arranged in a non-uniform manner.

Referring to FIG. 4, in an organic electroluminescence display 400 of the present invention, two pixels 410 for each of the R, G, B pixels are formed adjacent and opposite to each other. Each of the pixels 410 is composed of a switching thin film transistor, a capacitor, a driving thin film transistor, and an organic electroluminescence element connected to the driving thin film transistor. The organic electroluminescence element emits light as the switching thin film transistor and the driving thin film transistor are driven with a gate line 420 corresponding to a row of each pixel 410, a data line 430 corresponding to a column thereof, and a power line 440. The R, G, B pixels may be arranged variously. The pixels may be arranged, for example, in the form of a straight line (i.e., a column), as shown in FIG. 4.

The respective R, G, B pixels 410 are arranged in a non-uniform manner, unlike the pixels of the conventional organic electroluminescence display that are arranged in a uniform manner. In other words, the respective pixels are not formed in the same position and form, but two adjacent pixels are formed opposite to each other (i.e., a mirror image). The device has a structure in which the two opposite pixels are repeated.

Figure 5:
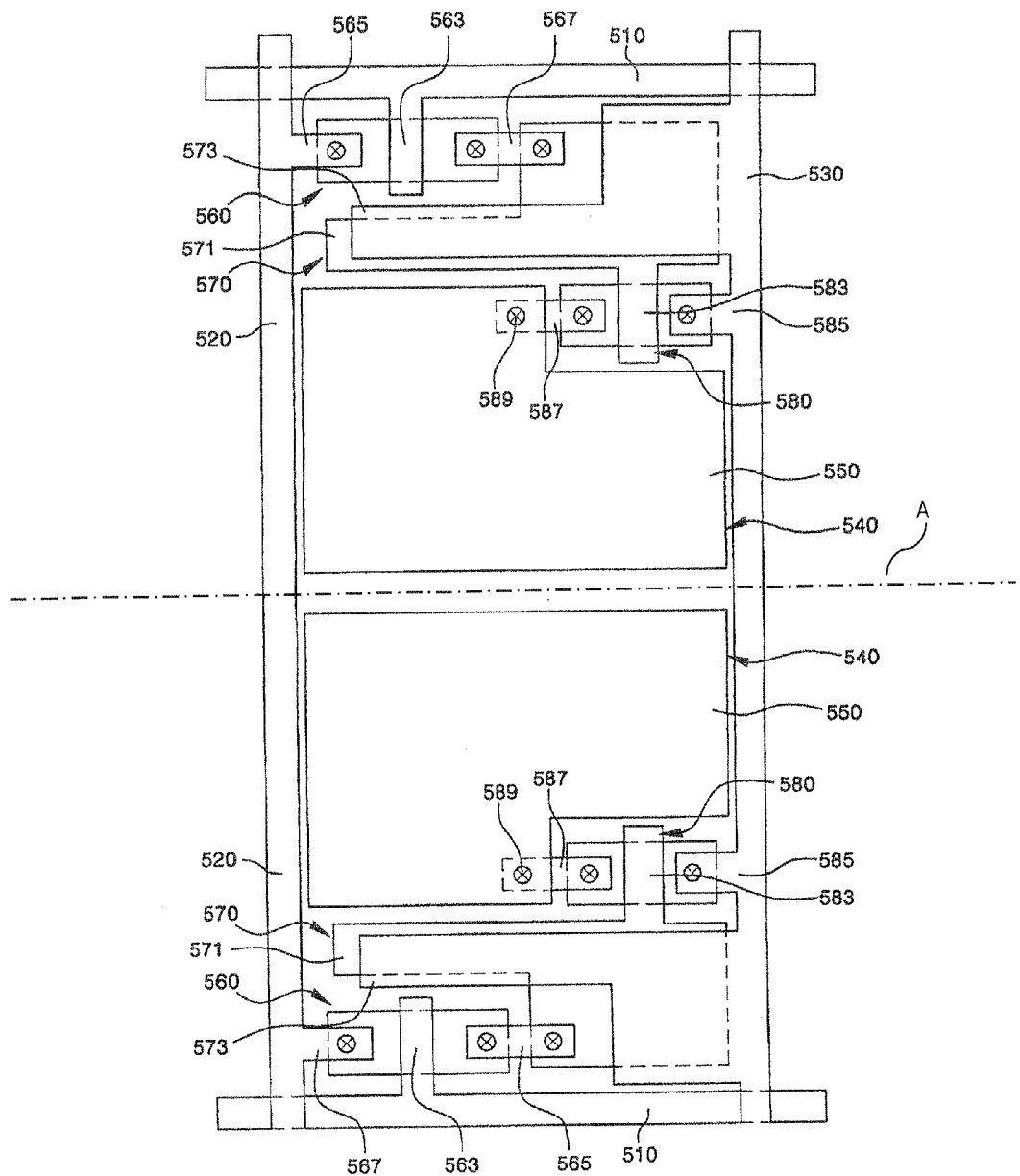

FIG. 5 is a top view illustrating an organic electroluminescence display according to a first exemplary embodiment of the present invention, in which each of the two adjacent pixels opposite to each other in FIG. 4 is shown only with a switching transistor, a capacitor, a driving transistor, and an organic electroluminescence element connected to the driving transistor. Axis of symmetry A bisects each of the pixel regions. Axis of symmetry A is indicated in FIGS. 5 through 8.

Referring to FIG. 5, the organic electroluminescence display of the present invention has a structure in which two pixels are formed opposite to each other within a pixel region defined by a data line 520, a power line 530, and two gate lines 510, namely, a non-uniform arrangement structure in which the pixels are formed in different positions from each other. In other words, when an organic emission layer is formed on a pixel electrode 550, the organic emission layer is integrally formed on one pixel electrode as well as on the opposite pixel electrode, namely, in the pixel region defined by the data line 520, the power line 530, and two gate lines 510.

One pixel includes a switching thin film transistor 560, a driving thin film transistor 580, a capacitor 570, and an emission region emitting light, wherein an organic electroluminescence element connected to the driving thin film transistor 580 is formed in the emission region.

A drain electrode 567 of the switching thin film transistor 560 is connected to the data line 520, a source electrode 565 is connected to a lower electrode 571 of the capacitor 570, and the gate electrode 563 is connected to the gate line 510.

A source electrode 585 of the driving thin film transistor 580 is connected to the power line 530, a drain electrode 587 is connected to the pixel electrode 550 through a via hole 589, and a gate electrode 583 is connected to an upper electrode 573 of the capacitor 570.

In each of the pixels of the organic electroluminescence display formed as described above, the data line 520 delivers an image signal, the gate line 510 delivers a selection signal, the switching thin film transistor 560 delivers data to the capacitor 570 in response to the selection signal of the gate line 510, and the capacitor 570 stores and holds the applied data. The driving thin film transistor 580 supplies current to the pixel electrode 550 to drive the organic electroluminescence element.

The two adjacent pixels also have the respective opposite current directions. In other words, a signal begins to be delivered through the gate lines 510 formed at both sides of the pixel portion and arrives at the organic electroluminescence element, which is similar to a direction when viewed in front of a mirror.

Further, the emission regions are equally biased, wherein in the emission regions, light emitted from each pixel in different pixel portions from each other, i.e., the pixel composed of the switching and driving thin film transistors, the capacitor, and the organic emission layer is taken out.

One pixel of the organic electroluminescence display of the present invention includes a driving thin film transistor having an active layer which is formed on an insulating substrate having a buffer layer and which has source and drain regions, a gate electrode formed on a gate insulating layer, and source and drain electrodes electrically connected to the source and drain regions through a contact hole. The pixel also includes an organic electroluminescence element composed of a lower electrode electrically connected to the thin film transistor, an organic emission layer, and an upper electrode.

The first pixel and the second pixel which are adjacent to each other are opened with the organic emission layer being shared therewith, and are formed opposite to each other. In other words, the two pixels face each other and have a structure in which respective components are arranged opposite to each other.

Figure 6:
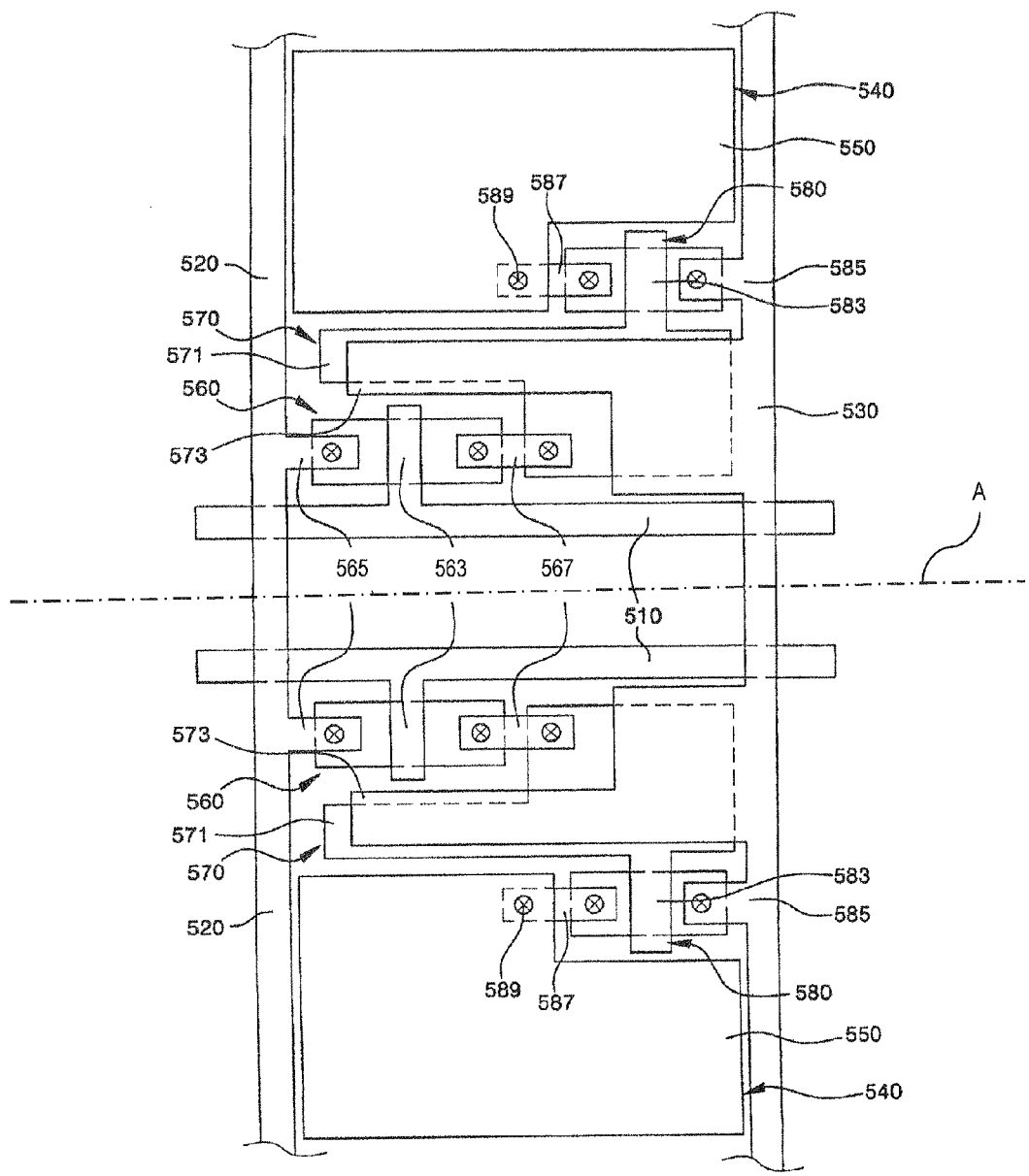
FIGS. 6 to 8 are top views illustrating a unit pixel structure of an organic electroluminescence display according to other exemplary embodiments of the present invention.

FIG. 6 is a top view illustrating an organic electroluminescence display according to a second exemplary embodiment of the present invention.

Referring to FIG. 6, a pixel structure of the organic electroluminescence display in the second exemplary embodiment has the same components as those in the first exemplary embodiment except that there is a difference in the arrangement of the components. In the first exemplary embodiment, two pixels 540 are integrally arranged between two gate lines 510 and are formed adjacent and opposite to each other while in the second exemplary embodiment, two gate lines 510 are formed adjacent to each other and the pixels 540 are formed symmetrically about the gate line 510.

Figure 7:
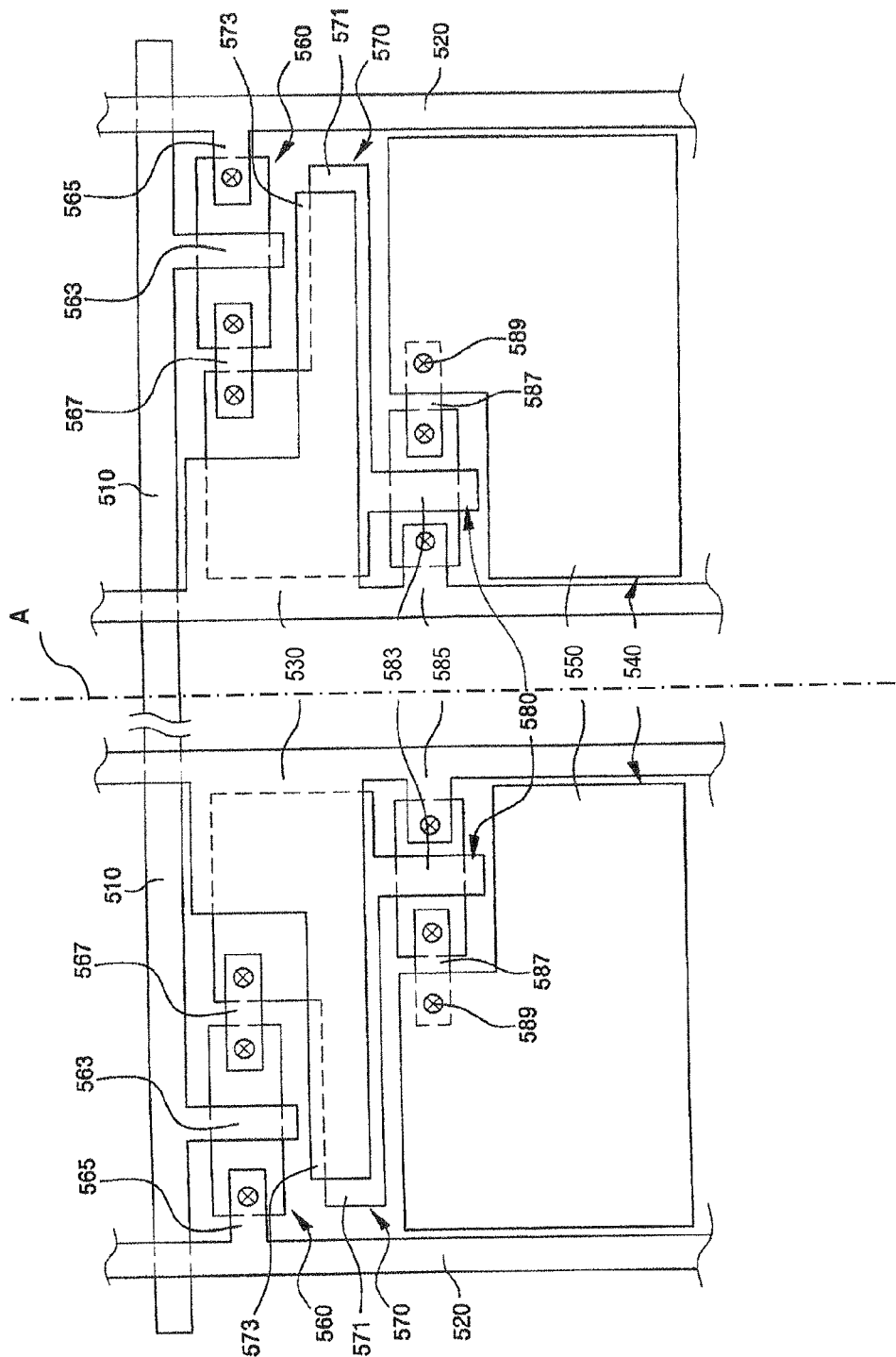

FIG. 7 is a top view illustrating an organic electroluminescence display according to a third exemplary embodiment of the present invention.

Referring to FIG. 7, a pixel structure of the organic electroluminescence display in the third exemplary embodiment has the same components as those in the first exemplary embodiment except that there is a difference in the arrangement of the components. In the first exemplary embodiment, the two pixels 540 are arranged integrally between the two gate lines 510 and are formed adjacent and opposite to each other while in the third exemplary embodiment, two pixels 540 share the gate line 510 and face each other about the common power line. Further, in the second exemplary embodiment, the two gate lines 510 are formed adjacent to each other and the two pixels 540 are formed to face each other about the gate lines 510 while in the third exemplary embodiment, the two pixels 540 share one gate line 510 and face each other about the common power line, as described above.

Figure 8:
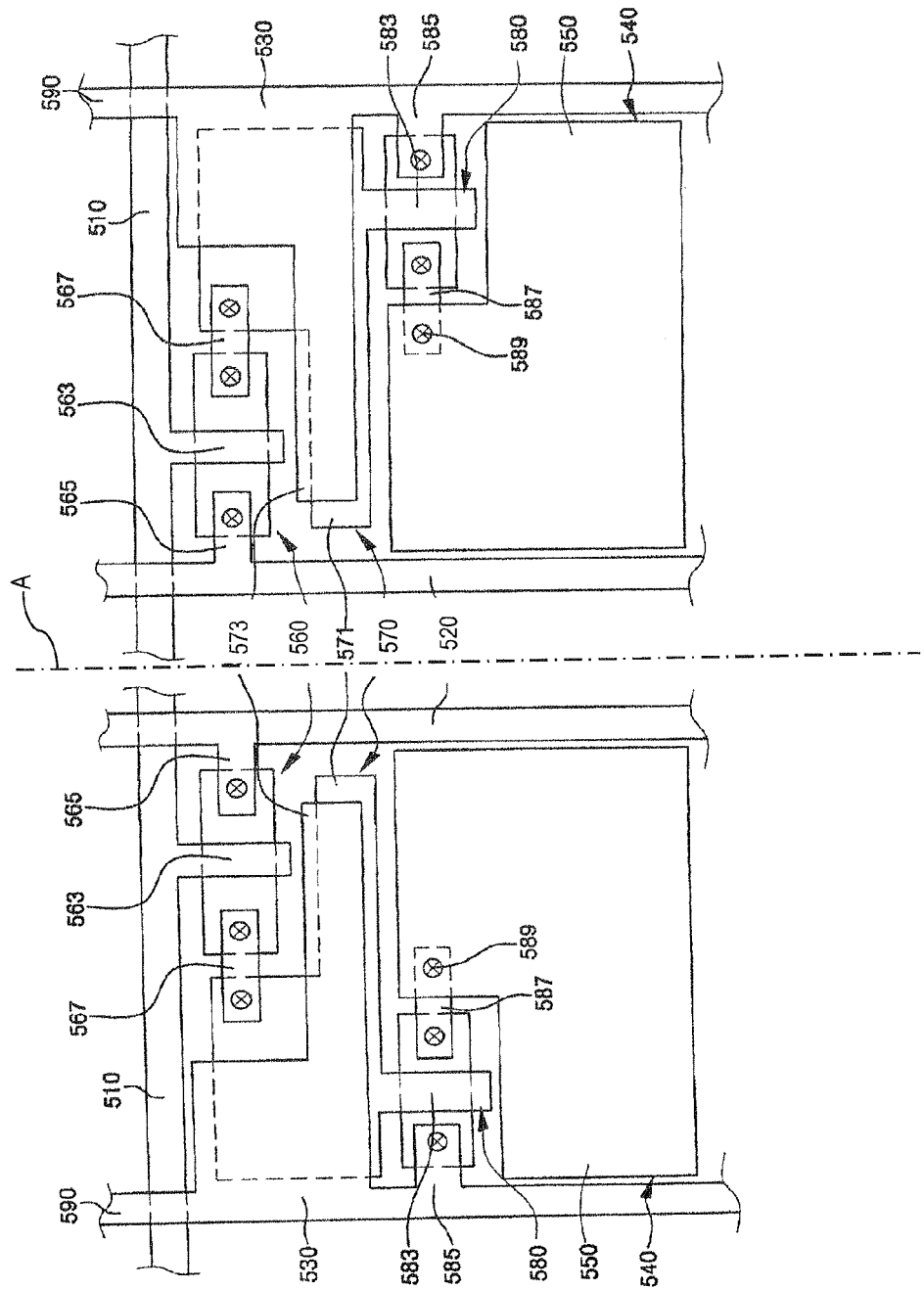

FIG. 8 is a top view illustrating an organic electroluminescence display according to a fourth exemplary embodiment of the present invention.

Referring to FIG. 8, a pixel structure of the organic electroluminescence display in the fourth exemplary embodiment is similar with that in the third exemplary embodiment except that there is a difference in its arrangement. In the third exemplary embodiment, the two pixels 540 are arranged to face each other about the common power line while in the fourth exemplary embodiment, the two data lines 520 are adjacent to each other and the two pixels 540 face each other about the data lines 520. Here, the gate line 510 is shared by the two pixels.

In the above-described exemplary embodiments of the present invention, because two opposite adjacent pixels of the same color share the organic emission layers and the organic emission layers are opened simultaneously, it is possible to obtain a higher aperture ratio compared to the method of forming the opening of the pixel in the conventional dot manner.

Further, it is possible to achieve the visibility of the organic electro luminescence display, because a more precise pattern is obtained as compared to the method of forming the opening of the pixel in the conventional stripe or delta manner.

As described above, according to the present invention, it is possible to provide an active matrix organic electro luminescence display in which two opposite pixels are formed in one pixel portion to achieve a high aperture ratio and to facilitate a fabrication process.

Although the preferred embodiments of the present invention have been described, it will be appreciated by those skilled in the art that various modifications and variations may be made to the present invention without departing from the spirit and scope the present invention set forth in the appending claims.

What is claimed is:

1. An organic electroluminescence display device, comprising:
    a plurality of gate lines, a plurality of data lines, and a plurality of power lines formed on an insulating substrate; and
    a plurality of pixel regions respectively defined by corresponding gate lines, corresponding data lines and corresponding power lines, each of the plurality of pixel regions comprising two neighboring pixels, the plurality of pixel regions arranged in a matrix form, and the two neighboring pixels in the each of the plurality of pixel regions, disposed on opposite sides of each axis of symmetry bisecting said each of the plurality of pixel regions and disposed in mirror symmetry with respect to each axis of symmetry, with each axis of symmetry being parallel to corresponding ones of the gate lines and with each axis of symmetry being geometrically distinct from the plurality of gate lines, data lines and power lines,
    wherein the two neighboring pixels emit light of a same color.

2. The device according to claim 1, wherein the two neighboring pixels share an emission layer.

3. The device according to claim 1, wherein the two neighboring pixels in each of the plurality of pixel regions are integrally arranged between two of the plurality of gate lines defining the each of the plurality of pixel regions, and the two neighboring pixels are formed immediately next to each other.

4. The device according to claim 1, wherein two of the plurality of gate lines defining each of said plurality of pixel regions are neighboring to each other, and the two neighboring pixels are formed symmetrically with respect to said two of the plurality of gate lines.

5. An organic electroluminescence display device, comprising:
    gate lines and data lines formed on an insulating substrate; and
    a plurality of pixel regions defined by the gate lines and the data lines, each of said plurality of pixel regions comprising a pair of light emission regions, with the pair of light emission regions disposed in each of the plurality of pixel regions emitting light of same color being arranged to be equally biased by the gate lines, the data lines and power lines, and the pair of light emission regions being disposed in a mirror symmetry within the each of the plurality of pixel regions with respect to each axis of symmetry bisecting each of the plurality of pixel regions, with each axis of symmetry being parallel to corresponding ones of the gate lines and with each axis of symmetry being geometrically distinct from the gate lines, the data lines and the power lines.

6. The device according to claim 5, wherein the pair of light emission regions in each of the plurality of the pixel regions share an emission layer.

7. The device according to claim 5, wherein the pair of light emission regions in each of the plurality of pixel regions are integrally formed between two of the gate lines defining each of said pixel regions, and the pair of light emission regions are formed immediately next to each other.

8. The device according to claim 5, wherein two of the gate lines defining each of said plurality of pixel portions are neighboring to each other, and the two light emission regions are formed symmetrically with respect to said two gate lines.

9. The device according to claim 5, wherein the pair of light emission regions share one of the gate lines and face each other.

10. The device according to claim 5, wherein two of the data lines defining each of said plurality of pixel portions are neighboring to each other, the pair of light emission regions are formed symmetrically with respect to said two of the data lines, and the pair of emission regions share one of the gate lines.

11. An organic electroluminescence display device, comprising:
    gate lines and data lines and power lines formed on an insulating substrate; and
    pixel portions partitioned by the gate lines and the data lines, each of said pixel portions having a first pixel and a second pixel disposed on opposite sides of each axis of symmetry bisecting each of said pixel portions and the first pixel and the second pixel being disposed in a mirror symmetry with respect to each axis of symmetry, with each axis of symmetry being parallel to corresponding ones of said gate lines and with each axis of symmetry being geometrically distinct from said gate lines, said data lines and said power lines, each of said first pixel and said second pixel comprising:
        a driving transistor adjusting an amount of emitted light by adjusting an amount of an electrical current of an electrical signal supplied to an organic emission portion;
        a switching transistor turned on by an electrical signal applied from the gate line to apply the electrical signal provided by the data line to the driving transistor; and
        the organic emission portion, directions of electrical currents of the electrical signals applied from the switching transistors of the first pixel and the second pixel to the organic emission portions of the first and second pixels being opposite to each other, wherein the first pixel and the second pixel emit light of a same color.

12. The device according to claim 11, wherein each of the organic emission portions of the first and second pixels includes a pixel electrode, an organic emission layer, and an upper electrode, and wherein the first pixel and the second pixel share the organic emission layer.

13. The device according to claim 11, wherein the first pixel and the second pixel are integrally arranged between two of said gate lines, and the first pixel and the second pixel are formed immediately next to each other and opposite to each other.

14. The device according to claim 11, wherein two of the gate lines defining each of said plurality of pixel portions are neighboring to each other, and the first pixel and the second pixel are formed symmetrically with respect to said two of the gate lines.

15. The device according to claim 11, wherein the first pixel and the second pixel share one of the gate lines and face each other.

* * * * *